(12) United States Patent
Dahlstrom et al.

(10) Patent No.: US 8,389,372 B2
(45) Date of Patent: Mar. 5, 2013

(54) HETEROJUNCTION BIPOLAR TRANSISTORS WITH REDUCED BASE RESISTANCE

(75) Inventors: Erik M. Dahlstrom, Burlington, VT (US); Peter B. Gray, Jericho, VT (US); Qizhi Liu, Waltham, MA (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 12/951,516

(22) Filed: Nov. 22, 2010

(65) Prior Publication Data

US 2012/0126292 A1     May 24, 2012

(51) Int. Cl.
    *H01L 21/331*     (2006.01)
    *H01L 21/8222*     (2006.01)

(52) U.S. Cl. ........................ 438/312; 257/197

(58) Field of Classification Search .................. 438/312; 257/197, E21.37, E29.188
See application file for complete search history.

(56) References Cited

U.S. PATENT DOCUMENTS

| | | | |
|---|---|---|---|
| 4,860,085 A | 8/1989 | Feygenson | |
| 5,986,323 A | 11/1999 | Zambrano | |
| 6,649,482 B1 | 11/2003 | Naem | |
| 2005/0151165 A1* | 7/2005 | Chan et al. | 257/198 |
| 2005/0199907 A1* | 9/2005 | Divakaruni et al. | 257/197 |
| 2007/0051980 A1* | 3/2007 | Hodge et al. | 257/197 |
| 2009/0283801 A1* | 11/2009 | Pagette et al. | 257/190 |

\* cited by examiner

*Primary Examiner* — Phuc Dang
(74) *Attorney, Agent, or Firm* — Wood, Herron & Evans, LLP; Anthony J. Canale

(57) ABSTRACT

Heterojunction bipolar transistors with reduced base resistance, as well as fabrication methods for heterojunction bipolar transistors and design structures for BiCMOS integrated circuits. The heterojunction bipolar transistor includes a conductive layer between the intrinsic base and the extrinsic base. The conductive layer is comprised of a conductive material, such as a silicide, having a lower resistivity than the materials forming the intrinsic base and the extrinsic base.

11 Claims, 7 Drawing Sheets

HETEROJUNCTION BIPOLAR TRANSISTORS WITH REDUCED BASE RESISTANCE

BACKGROUND

The invention relates generally to semiconductor device fabrication and, in particular, to heterojunction bipolar transistors with a reduced base resistance, as well as fabrication methods for heterojunction bipolar transistors and design structures for BiCMOS integrated circuits.

Bipolar junction transistors are typically found in demanding types of analog circuits, especially analog circuits used in high-frequency applications. Bipolar junction transistors are found in radiofrequency integrated circuits (RFICs) used in wireless communications systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors include three semiconductor regions, namely the emitter, base, and collector regions. Generally, a bipolar junction transistor includes a pair of p-n junctions, namely an emitter-base junction and a collector-base junction. A heterojunction bipolar transistor (HBT) is a variety of bipolar junction transistor that employs at least two semiconductor materials with unequal band gaps for the emitter and base regions, creating a heterojunction. For example, the base of a HBT may be comprised of silicon germanium (SiGe), which is characterized by a narrower band gap than silicon typically composing the emitter of the HBT.

Improved devices are needed for HBT's that boost device performance, as well as improved fabrication methods for HBT's and design structures for BiCMOS integrated circuits.

BRIEF SUMMARY

In an embodiment of the invention, a method is provided for fabricating a heterojunction bipolar transistor. The method includes forming a first layer comprised of a material capable of forming an intrinsic base, forming a second layer on a top surface of the first layer, and forming a third layer on a top surface of the second layer. The third layer is comprised of a material capable of forming an extrinsic base. The second layer is comprised of a conductive material having a lower resistivity than the material of the first layer and a lower resistivity than the material of the third layer.

In an embodiment of the invention, a heterojunction bipolar transistor includes an emitter, a collector in an active region of a substrate, an intrinsic base arranged between the emitter and the collector, the intrinsic base comprised of a first material, an extrinsic base comprised of a second material, and a conductive layer between the intrinsic base and the extrinsic base. The conductive layer is comprised of a third material having a lower resistivity than the first material of the intrinsic base and a lower resistivity than the second material of the extrinsic base.

In another embodiment, a hardware description language (HDL) design structure is encoded on a machine-readable data storage medium. The HDL design structure comprises elements that, when processed in a computer-aided design system, generates a machine-executable representation of a heterojunction bipolar transistor. The HDL design structure comprises an emitter, a collector in an active region of a substrate, an intrinsic base arranged between the emitter and the collector, the intrinsic base comprised of a first material, an extrinsic base comprised of a second material, and a conductive layer between the intrinsic base and the extrinsic base. The conductive layer is comprised of a third material having a lower resistivity than the first material of the intrinsic base and a lower resistivity than the second material of the extrinsic base. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
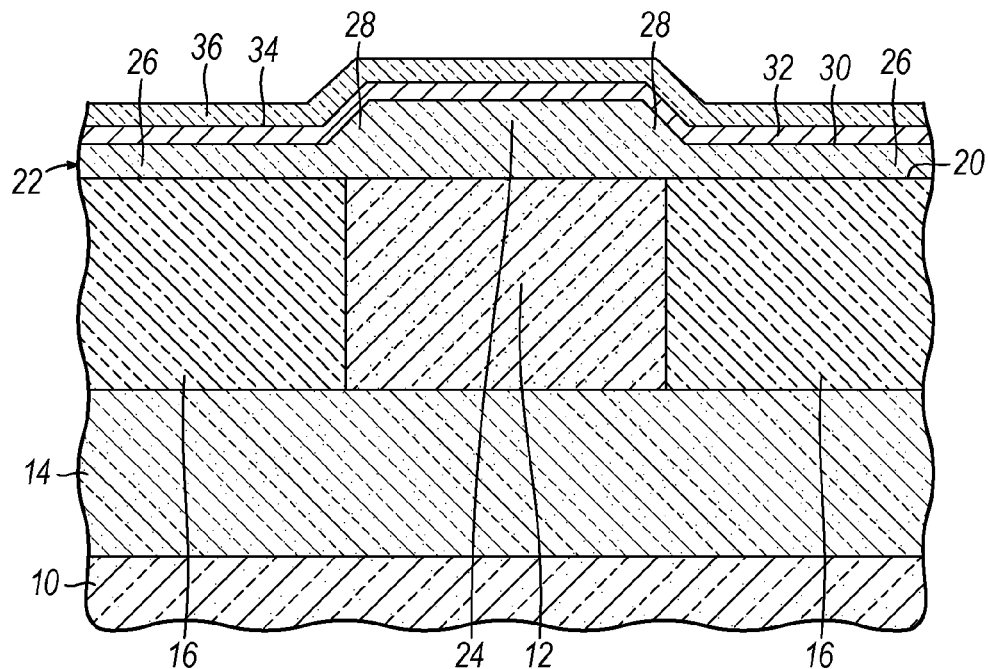
FIGS. 1-8 are cross-sectional views of a portion of a substrate at an initial fabrication stage of a processing method for fabricating a device structure in accordance with an embodiment of the invention.

With reference to FIG. 1 and in accordance with an embodiment of the invention, a substrate 10 is comprised of a semiconductor material. Substrate 10 may be any suitable bulk substrate containing a semiconductor material that a person having ordinary skill in the art would recognize as suitable for forming an integrated circuit. For example, substrate 10 may be comprised of a monocrystalline silicon-containing material, such as single crystal silicon with a (100) crystal lattice orientation. The monocrystalline semiconductor material contained in the substrate 10 may contain a definite defect concentration and still be considered single crystal. The semiconductor material constituting substrate 10 may be lightly doped with an impurity to alter its electrical properties. Specifically, the substrate 10 may be lightly doped with a p-type impurity species, such boron, to render it initially p-type.

A collector 12 and a subcollector 14 of a heterojunction bipolar transistor 74 (FIG. 8) are defined as impurity-doped regions in the substrate 10. The collector 12 and subcollector 14 are doped with different concentrations of an electrically-active dopant, such as an impurities species from Group V of the Periodic Table (e.g., arsenic) effective to impart an n-type conductivity in which electrons are the majority carriers and dominate the electrical conductivity of the semiconductor material. The collector 12 and the subcollector 14 may be formed by ion implantation of an n-type dopant and annealing to activate the dopant using techniques and conditions familiar to one skilled in the art. For example, the collector 12 may comprise a selectively implanted collector (SIC) formed by implanting an n-type dopant with selected dose and kinetic energy.

Trench isolation regions 16 are formed by a conventional process in the substrate 10. In one embodiment, the trench isolation regions 16 may be formed by a shallow trench isolation (STI) technique that relies on a lithography and dry etching process to define closed-bottomed trenches in substrate 10, fills the trenches with dielectric, and planarizes the layer to a top surface 20 of the substrate 10 using a chemical mechanical polishing (CMP) process. The CMP process combines abrasion and dissolution to remove excess dielectric from the top surface 20 of substrate 10. The dielectric may be an oxide of silicon, such as densified tetraethylorthosilicate (TEOS) deposited by thermal chemical vapor deposition (THCVD) or a high-density plasma (HDP) oxide deposited with plasma assistance. The trench isolation regions 16 circumscribe and electrically isolate an active region of the substrate 10 that is used in the fabrication of the heterojunction bipolar transistor 74 (FIG. 8) and that contains the collector 12.

A layer 22, which is comprised of a material suitable for forming an intrinsic base of the heterojunction bipolar transistor 74, is deposited on the top surface 20 of substrate 10 and, in particular on the active region of the substrate 10. Layer 22 may be formed using a low temperature epitaxial (LTE) growth process (typically at a growth temperature ranging from 450° C. to 850° C.). Layer 22 may contain a semiconductor material comprised of silicon (Si) and germanium (Ge) in a $Si_xGe_{1-x}$ alloy having a germanium content in a range between about 5 atomic percent and about 50 atomic percent. The germanium content of the layer 22 may be uniform or the germanium content of layer 22 may be graded or stepped across the thickness of layer 22.

Layer 22 includes a raised region 24 laterally positioned in vertical alignment with the collector 12 and active region of the substrate 10, a field region 26 encircling the raised region 24 and overlying the trench isolation regions 16, and a facet region 28 connecting the raised region 24 and field region 26. Layer 22 is monocrystalline in the raised region 24, polycrystalline in the field region 26, and either a mixture of polycrystalline and monocrystalline in facet region 28 or primarily monocrystalline in facet region 28. The thickness of the layer 22 may range from about 10 nm to about 600 nm with the largest layer thickness in the raised region 24. As the thickness of layer 22 increases, the width of the raised region 24 likewise increases so that the facet region 28 moves laterally outward relative to the centerline of the raised region 24.

A layer 32, which contains a material with a different composition than layer 22, is deposited on a top surface 30 of layer 22. In one embodiment, layer 32 directly contacts the top surface 30. Layer 32 may be comprised of a dielectric, which is an insulating material having a lesser degree of electrical conduction and a higher dielectric constant than layer 22. In one embodiment, layer 32 may be a high temperature oxide (HTO) deposited using low pressure chemical vapor deposition (LPCVD) at temperatures of 500° C. or higher, and may be comprised of an oxidized silicon, such as stoichiometric silicon dioxide ($SiO_2$). Alternatively, layer 32 may be deposited or grown by another suitable process. The physical layer thickness of layer 32 may be on the order of about 15 nm.

A layer 36, which contains a material with a different composition than layer 32, is deposited on a top surface 34 of layer 32. In one embodiment, layer 36 directly contacts the top surface 34. Layer 36 may be comprised of a dielectric with a different dielectric constant than layer 32 and different etching selectivity. In one embodiment, layer 36 may be comprised of silicon nitride ($Si_3N_4$) deposited using LPCVD or rapid-thermal chemical vapor deposition (RTCVD). Alternatively, layer 36 may be deposited by another suitable process. The physical layer thickness of layer 36 may be on the order of about 15 nm.

Figure 2:
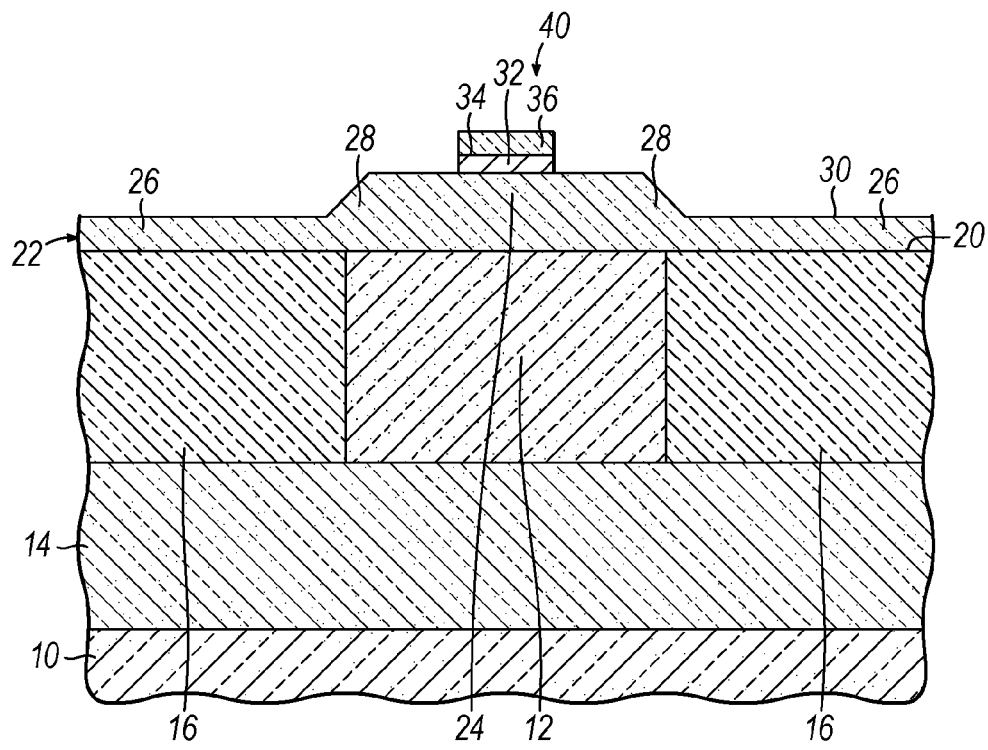

With reference to FIG. 2 in which like reference numerals refer to like features in FIG. 1 and at a subsequent fabrication stage, the layer stack consisting of layers 32,36 is patterned using photolithography and subtractive etching processes to define a landing pad, generally indicated by reference numeral 40. To that end, the layer stack consisting of layers 32, 36 is masked with a patterned mask layer (not shown). In one embodiment, the mask layer may be a photoresist layer comprised of a sacrificial organic material applied to the top surface 34 of layer 32 by spin coating. The photolithography process entails exposing the photoresist layer to radiation imaged through a photomask and developing the resultant latent feature pattern in the exposed resist to define residual areas of photoresist that mask portions of layers 32, 36. A subtractive etching process, such as a reactive-ion etching (RIE) process or a wet chemical etching process, is used to remove regions of layers 32, 36 not protected by the mask layer. An initial segment of the etching process removes the unprotected regions of layer 36 and stops on the material of layer 32 and then the etch chemistry is changed to remove the unprotected regions of the underlying layer 32. At the conclusion of the subtractive etching process, the top surface 30 of layer 22 is exposed aside from the portion covered by the landing pad 40.

Figure 3:
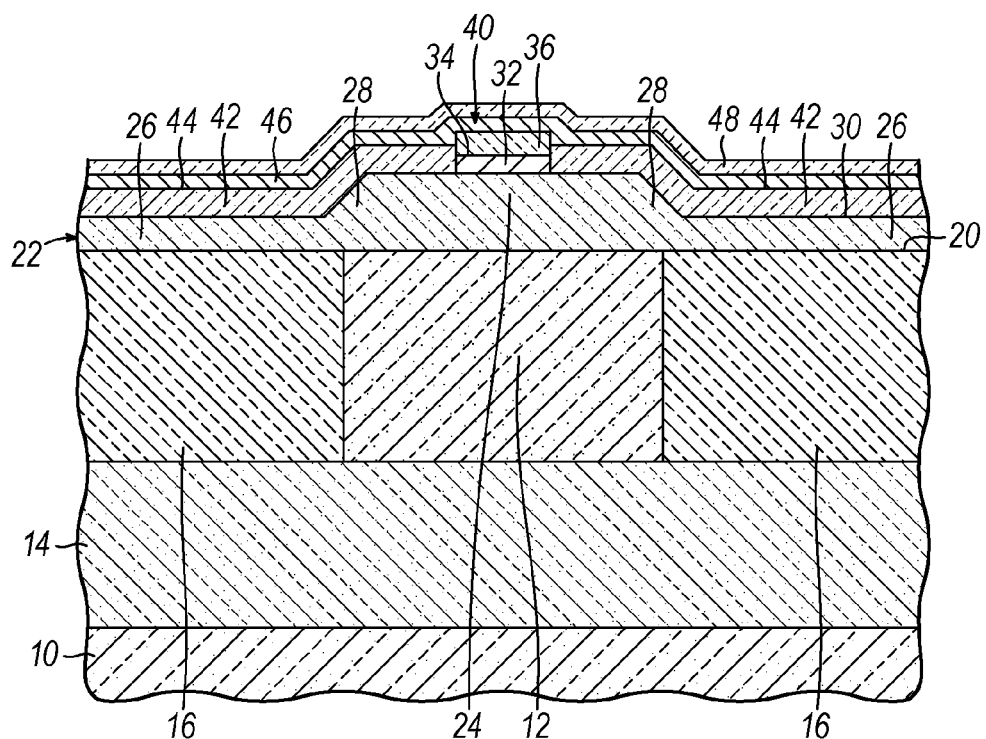

With reference to FIG. 3 in which like reference numerals refer to like features in FIG. 2 and at a subsequent fabrication stage, a sub-layer 42 comprised of a semiconductor material is formed on the top surface 30 of layer 22. In one embodiment, sub-layer 42 directly contacts the top surface 30. Sub-layer 42 may be comprised of silicon or an alloy of silicon and germanium.

Sub-layer 42 may be comprised of silicon formed by a selective epitaxial growth (SEG) process. The semiconductor material of layer 22 operates as a seed crystal or crystalline seed that establishes a crystallographic pattern for the semiconductor material in sub-layer 42 in which the crystallographic pattern of layer 22 is reproduced so that layers 22, 42 have the same lattice structure and crystalline orientation. The sub-layer 42 may be intrinsic material or may be doped in situ during epitaxial growth to have the same conductivity type as the layer 22. The SEG process is usually performed at sub-atmospheric process pressures (e.g., 40 torr) and typically with a substrate temperature between about 450° C. and about 1050° C. Growth is not initiated during the SEG process on layer 36 on landing pad 40 so that the landing pad 40 remains uncovered by sub-layer 42.

A sub-layer 46 comprised of a silicide-forming metal is formed on a top surface 44 of sub-layer 42 and over the landing pad 40. Sub-layer 46 may be a blanket layer deposited by, for example, a CVD process or a physical vapor deposition (PVD) process. In various embodiments, candidate refractory metals for sub-layer 46 include titanium (Ti), cobalt (Co), or nickel (Ni), which have sintering temperatures of 900° C. or less, exhibit stability on silicon up to a temperature of 950° C., are characterized by a resistivity in a range of 10 µΩ-cm to 20 µΩ-cm, and that are thermally stable during subsequent processing steps. The metal silicide $TiSi_2$ (C54) is characterized by a resistivity of 13-16 µΩ-cm, has a sintering temperature in a range of 700° C. to 900° C., and is stable on silicon up to a temperature of about 900° C. The metal silicide $CoSi_2$ is characterized by a resistivity of 14-20 µΩ-cm, has a sintering temperature in a range of 600° C. to 800° C., and is stable on silicon up to a temperature of about 950° C. The metal silicide NiSi is characterized by a resistivity of 14-20 µΩ-cm, has a sintering temperature in a range of 400° C. to 600° C., and is stable on silicon up to a temperature of about 650° C. Other suitable, but less desirable, candidate metals may include tungsten (W) and platinum (Pt). Preferably, the silicide in sub-layer 46 represents the lowest resistivity phase of the particular metal silicide and is thermally stable at temperatures of subsequent processing steps. A capping layer 48 comprised of a metal nitride, such as titanium nitride (TiN) deposited by direct current (DC) sputtering or radio frequency (RF) sputtering, may be applied across sub-layer 46.

The physical layer thickness of sub-layer 46 is selected such that less than the entire thickness of sub-layer 42 is consumed when the silicide layer 50 is formed. In one embodiment, the semiconductor material constituting sub-layer 42 may have a layer thickness of 20 nm to 150 nm, the silicide-forming metal constituting sub-layer 46 may have a layer thickness of 5 nm to 50 nm, and the capping layer 48 may have a layer thickness of 3 nm to 30 nm.

Figure 4:
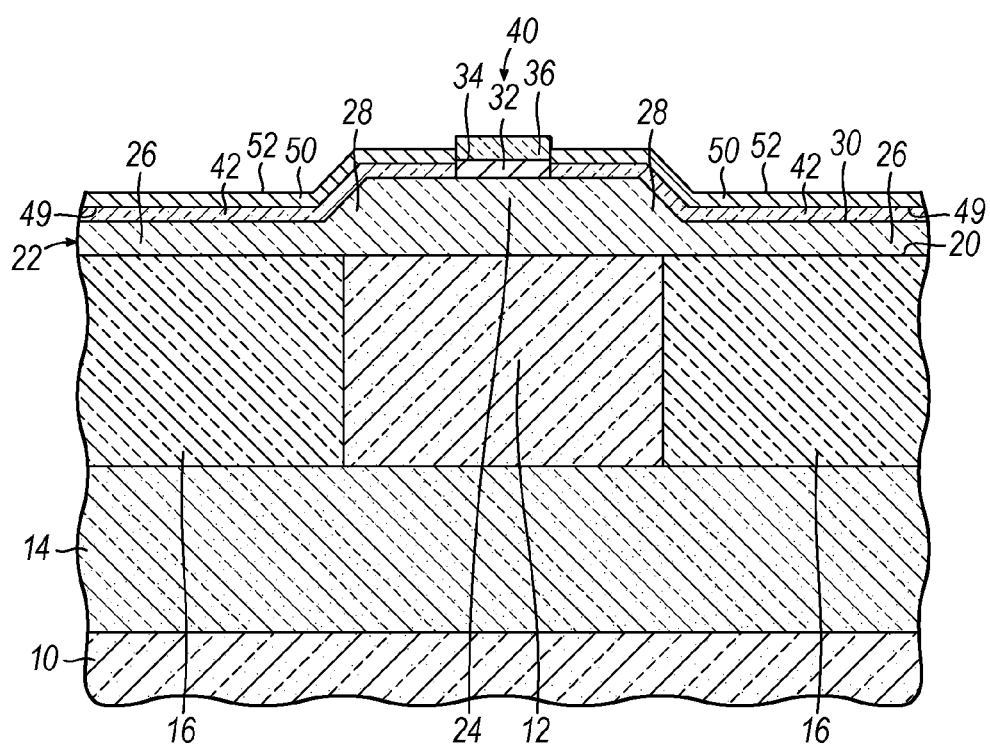
Figure 5:
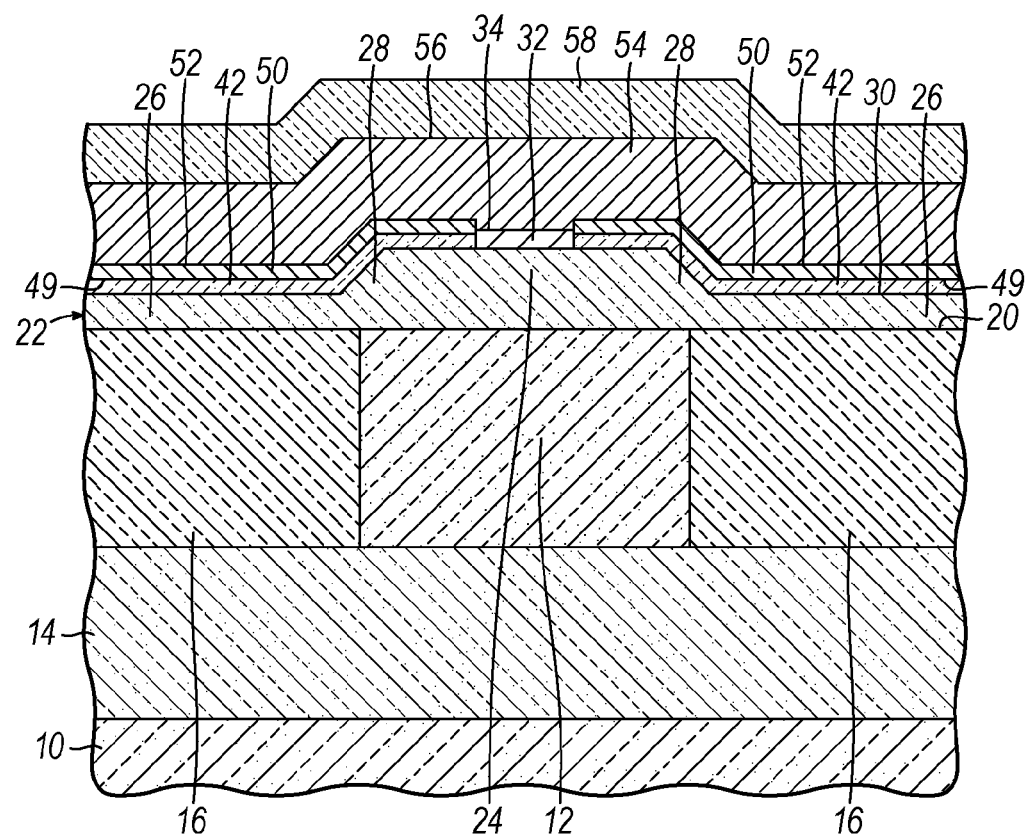

With reference to FIG. 4 in which like reference numerals refer to like features in FIG. 3 and at a subsequent fabrication stage, a silicide layer 50 is formed from the layers 42, 46 using a silicidation process that involves one or more annealing steps to form a silicide phase from layers 42, 46, and then selectively etches any non-reacted metal. The silicide phase constituting silicide layer 50 may be characterized as a silicon-germanium silicide if sub-layer 42 contains Si and Ge. While silicide is a preferred material, layer 50 may be comprised of a material having a lower resistivity than the material of the layer 22 and a lower resistivity than the material of the layer 54 (FIG. 5).

In a representative silicidation process, the layers 42, 46 are heated or annealed at a temperature sufficient to react the metal in sub-layer 46 with the semiconductor material (e.g., Si or SiGe) of sub-layer 42 and form the silicide material. The formation anneal is performed employing ambients and temperatures well known in the art that cause the silicide metal in sub-layer 46 to react with the underlying silicon or silicon germanium in sub-layer 42 to form the silicide layer 50. For example, the silicidation process may be conducted in an ambient consisting an inert gas or nitrogen atmosphere, and by heating the silicide-forming metal utilizing one or more rapid thermal annealing (RTA) steps at an annealing temperature, which is contingent on the type of silicide, of about 400° C. to about 900° C. In silicidation processes, metal-rich silicides initially form and continue to grow until the metal in layer 48 is consumed. When the layer 48 has been consumed, silicides of lower metal content begin to appear and can continue to grow by consuming the metal-rich silicides.

The silicide layer 50 has a bottom surface 49 that, in the representative embodiment, is in direct contact with the residual portion of sub-layer 42 and is in indirect contact with layer 22, as well as a top surface 52 opposite the bottom surface 49 and separated from sub-layer 42 by the thickness of silicide layer 50. In one embodiment, the silicide layer 50 may have a physical layer thickness in a range of 8 nm to 80 nm. A residual thickness of sub-layer 42 preferably remains after the silicide layer 50 is formed and separates the silicide layer 50 from layer 22. In one embodiment, the residual thickness of sub-layer 42 may range from 4 nm to 60 nm. If sub-layer 42 is consumed by the silicidation process, then the silicide layer 50 may be in direct contact with layer 22.

After annealing to induce the metallurgical reaction forming silicide layer 50, any unreacted metal from sub-layer 46 that was not converted into silicide during silicidation and the capping layer 48 may be removed with, for example, selective wet chemical etch processes. Any silicide-forming metal in sub-layer 46 that is not in contact with the material of sub-layer 42 (e.g., the silicide-forming metal that is deposited on the landing pad 40) does not react when heated to form silicide. The wet chemical etch process for removing the unreacted metal may utilize, for example, a $H_2O_2/H_2SO_4$ solution or a $HNO_3/HCl$ solution. The wet chemical etch process for removing the capping layer 48, if comprised of TiN, may utilize a $HNO_3/HF$ solution or a mixture of $NH_4OH:H_2O_2:H_2O$(SC1 solution).

After the unreacted metal from sub-layer 46 and the capping layer 48 are removed, the silicide layer 50 may be subjected to another anneal process to form a lower-resistance phase for the specific silicide used in layer 50. The temperature for the transformation anneal of the silicide layer 50 may be higher that the temperature of the formation anneal.

With reference to FIG. 5 in which like reference numerals refer to like features in FIG. 4 and at a subsequent fabrication stage, the upper layer 36 in the landing pad 40 is removed to expose the lower layer 32 of landing pad 40. The removal of layer 36 from landing pad 40, which is optional in the process flow, may be performed using a reactive ion etching (RIE) process or a hot phosphoric acid etch.

A layer 54 comprised of a conductive material suitable to participate in forming an extrinsic base of the heterojunction bipolar transistor 74 (FIG. 8) is deposited on the top surface 52 of the silicide layer 50. In one embodiment, the semiconductor material of layer 54 may be a single layer comprised of polycrystalline silicon (e.g., polysilicon) deposited by a conventional deposition process. Layer 54 may be in-situ doped during deposition with a concentration of a dopant, such as an impurity species from Group III of the Periodic Table (e.g., boron) effective to impart a p-type conductivity in which holes are the majority carriers and dominate the electrical conductivity of the constituent semiconductor material.

A non-conductive insulating layer 58 is applied to a top surface 56 of layer 54. The insulating layer 58 may be an isolation oxide comprised of a dense $SiO_2$ deposited by a conventional deposition process, such as THCVD using TEOS as a reactant, and may have a thickness after formation of about 150 nm.

Figure 6:
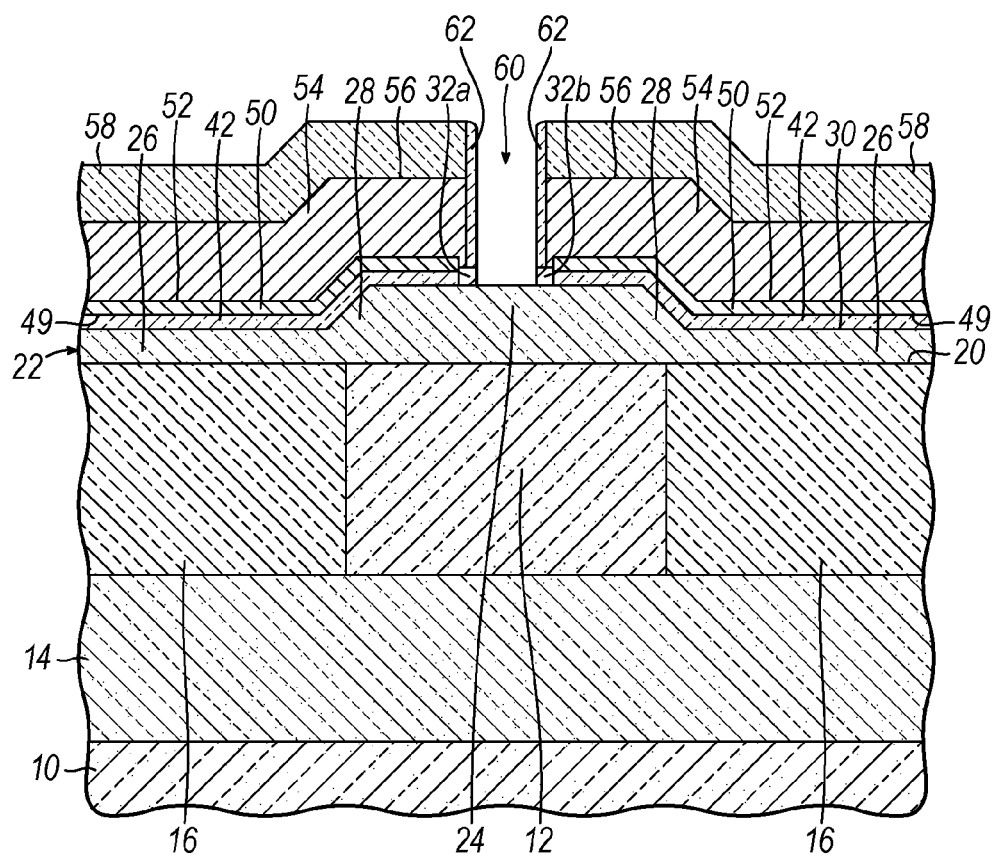

With reference to FIG. 6 in which like reference numerals refer to like features in FIG. 5 and at a subsequent fabrication stage, layers 50, 54, 58 are patterned using photolithography and subtractive etching processes to define an emitter window 60 as an opening that extends to the depth of, and lands on, the residual portion of the emitter landing pad defined by layer 32. A two-step subtractive etching process is used that has a chemistry that is effective to etch the material of layer 58 and then different chemistries that are effective to etch the materials of layers 54. The latter portion of the etching process stops on the material of layer 32.

Spacers 62 are formed on the sidewalls of the portions of layers 32, 54, 58 that border the emitter window 60. In a representative embodiment, the spacers 62 are formed from a non-conductive, dielectric material that is shaped by a directional anisotropic etching process, such as a RIE process, to preferentially remove the dielectric material from horizontal surfaces. The dielectric material used to form the spacers 62 may be a thin layer of $Si_3N_4$ deposited by a CVD process or a bilayer consisting of thin discrete layers of $Si_3N_4$ and $SiO_2$ also deposited by CVD. An etching process, such as chemical oxide removal (COR), that stops on layer 22 is used to remove the material of layer 32 exposed by the emitter window 60. Residual portions 32a, 32b of layer 32, which are protected by the spacers, remain at the conclusion of the etching process.

Figure 7:
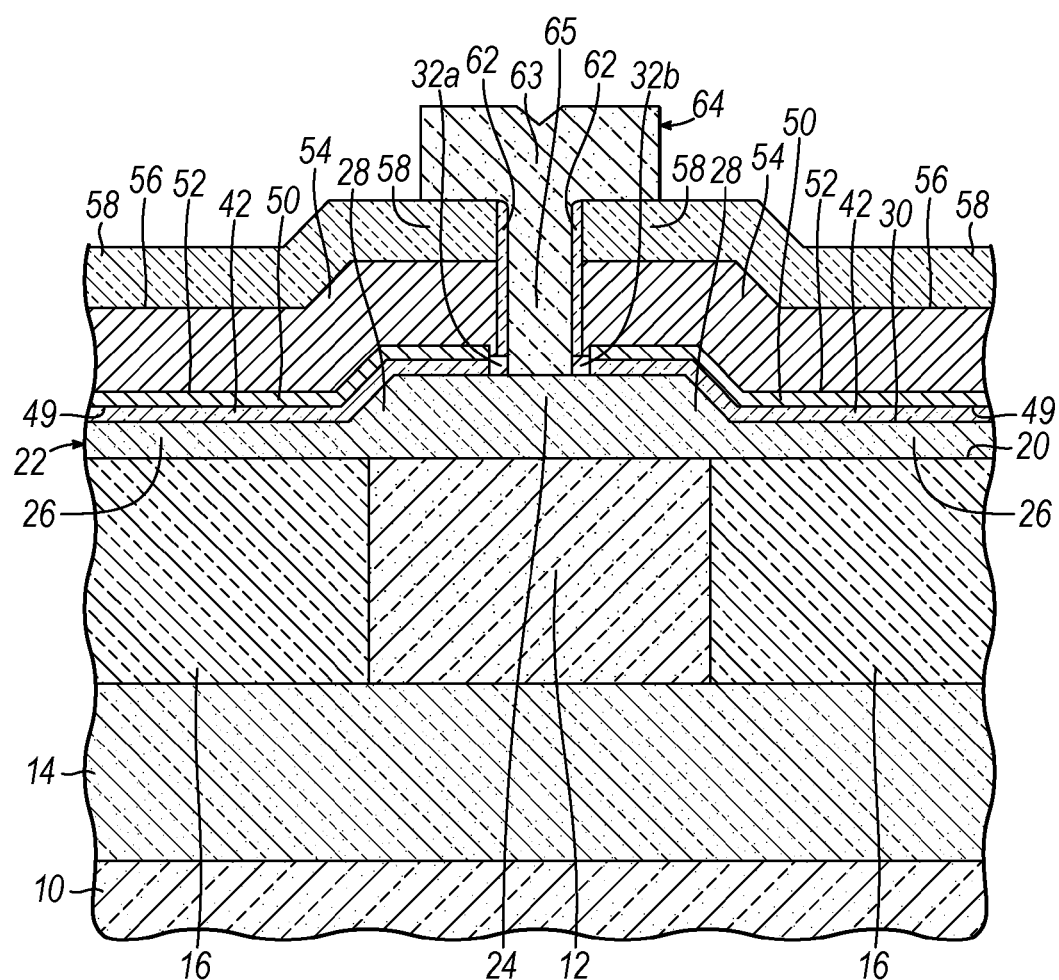

With reference to FIG. 7 in which like reference numerals refer to like features in FIG. 6 and at a subsequent fabrication stage, a T-shaped emitter 64 of the heterojunction bipolar transistor 74 (FIG. 8) is then formed by depositing a layer comprised of a heavily-doped semiconductor material and then patterning the layer with a lithography and etching process. For example, the emitter 64 may be formed from polysilicon heavily doped with a concentration of a dopant, such as an impurities species from Group V of the Periodic Table (e.g., arsenic) effective to impart an n-type conductivity in which electrons are the majority carriers and dominate the electrical conductivity of the semiconductor material. An optional layer of a dielectric material, such as $Si_3N_4$, may be applied before the emitter 64 is patterned. A portion of the doped semiconductor material of the emitter 64 fills the emitter window 60 (FIG. 6) and is directly connected with layer 22. Another portion of the doped semiconductor material of the emitter 64 covers the insulating layer 58 and projects above the portion filling the emitter window 60.

The lithography process forming emitter 64 from the layer of heavily-doped semiconductor material may utilize a negative photoresist to mask only a strip of the doped semiconductor material above the portion filling the emitter window 60. An etching process that stops on the material of insulating layer 58 is selected to shape the emitter 64. The mask is stripped from the surface after shaping the emitter 64, which exposes a top surface of insulating layer 58.

Figure 8:
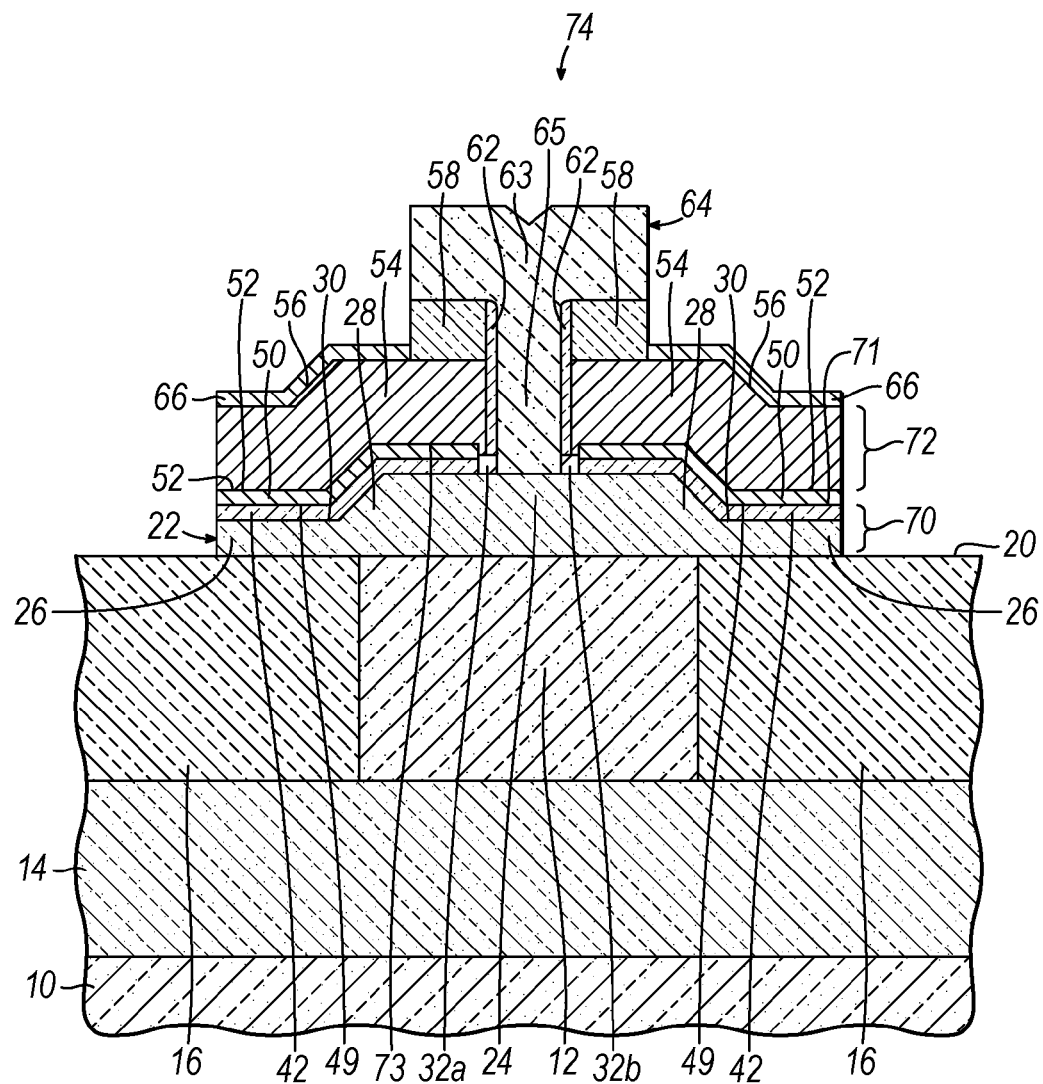

With reference to FIG. 8 in which like reference numerals refer to like features in FIG. 7 and at a subsequent fabrication stage, layers 22, 42, 50, 54, 66 are patterned using conventional photolithography and etching processes to laterally define an intrinsic base 70 of the heterojunction bipolar transistor 74 from the residual portion of layers 22, 42 and an extrinsic base 72 of the heterojunction bipolar transistor 74 from the residual portions of layer 54, as well as trim the dimensions of the silicide layer 50 disposed between the intrinsic base 70 and extrinsic base 72. After patterning, the heterojunction bipolar transistor 74 has a vertical architecture in which the intrinsic base 70 is located between the emitter 64 and the collector 12, and the emitter 64, intrinsic base 70, the silicide layer 50, and the collector 12 have a vertical arrangement. The extrinsic base 72 extends laterally to permit contact access to the intrinsic base 70 using the silicide layer 66. The spacers 62 and residual portions 32a, 32b of layer 32 have a thickness to ensure that the emitter 64 is not shorted to the extrinsic base defined by layers 50, 54.

Insulating layer 58 is removed over regions not masked by a head 63 of the emitter 64 to expose the top surface 56 of the residue of layer 54 defining the extrinsic base 72. Either a dry etching process, like RIE, or a wet chemical etching process, like buffered hydrofluoric acid (BHF), may be used to remove the material of insulating layer 58 selectively to the material of layer 54.

A silicide layer 66 is formed on the exposed top surface 56 of layer 54. The silicide layer 66 lowers the contact resistance between layer 54 used to form the extrinsic base and a later-formed overlying conductive via (not shown) that lands on the layer 54. The silicide layer 66, which is similar to layer 50, may be prepared in the manner as described above for layer 50. A block mask may be used to prevent silicide formation on the emitter 64.

The conductivity types of the semiconductor materials constituting the emitter 64 and extrinsic base 72 are opposite. The semiconductor material of the extrinsic base 72, which may be a SiGe alloy doped with boron and/or carbon, may have a narrower band gap than the materials (e.g., silicon) of the emitter 64 and collector 12, in which case the heterojunction bipolar transistor 74 has a Si/SiGe heterojunction.

The silicide material in silicide layer 50 possesses a relatively low resistivity in comparison with the materials forming the intrinsic and extrinsic bases 70, 72. The silicide material in silicide layer 50 possesses the ability to withstand high temperature processes during fabrication steps subsequent to its introduction into the process flow. Formation of the silicide layer 50 introduces a minimal number of additional steps into the process flow used to form the heterojunction bipolar transistor 74. The bottom surface 49 of the silicide layer 50 is in contact with a top surface 71 of the intrinsic base 70, and the top surface 52 of the silicide layer 50 is in contact with a bottom surface 73 of the extrinsic base 72.

Portions of the silicide layer 50 extend beneath the head 63 of the emitter 64 and overlie the raised region 24 of the layer 22 forming the intrinsic base 70. The silicide layer 50 has an opening occupied by the residual portions 32a, 32b of layer 32 and the stem 65 of the emitter 64. On the other hand, the silicide layer 66 has a larger opening determined by the width of the head 63 of the emitter 64. The dimensions of the head 63 are determined to a large extent by the need to provide an overlay margin to ensure that with an overlying local interconnect contact lands on the emitter 64.

The spatial proximity of the silicide layer 50 to the intrinsic base 70, in comparison to the spatial proximity of silicide layer 66, operates to reduce the base resistance $R_b$ of the heterojunction bipolar transistor 74. As a numerical example, the sheet resistance of the silicide layer 50 may be on the order of several ohms per square, while the sheet resistance of the material forming the extrinsic base 72 may be on the order of 100 ohms per square and the sheet resistance of the material forming the intrinsic base 70 may be on the order of 1000 ohms per square. The addition of the silicide layer 50 significantly reduces the composite sheet resistance and, thereby, significantly reduces the base resistance $R_b$. The base resistance $R_b$ is a significant parasitic because it provides an electrical feedback path between the output and input of the heterojunction bipolar transistor 74. The reduction in the base resistance improves the performance of the heterojunction bipolar transistor 74 by increasing the maximum operating frequency $f_{max}$, which is a function of base resistance $R_b$.

During the front-end-of-line (FEOL) portion of the fabrication process, the device structure of the heterojunction bipolar transistor 74 is replicated across at least a portion of the surface area of the substrate 10. In BiCMOS integrated circuits, complementary metal-oxide-semiconductor (CMOS) transistors (not shown) are formed using other regions of the substrate 10. As a result, both bipolar and CMOS transistors available on the same substrate 10.

Standard back-end-of-line (BEOL) processing follows, which includes formation of contacts and wiring for the local interconnect structure, and formation of dielectric layers, via plugs, and wiring for an interconnect structure coupled by the local interconnect wiring with the heterojunction bipolar transistor 74, as well as other similar contacts for additional device structures like heterojunction bipolar transistor 74 and CMOS transistors (not shown) included in other circuitry fabricated on the substrate 10. Other passive circuit elements, such as resistors, capacitors, varactors, and inductors, may be fabricated on substrate 10 and available for use in the BiCMOS integrated circuit.

Figure 9:
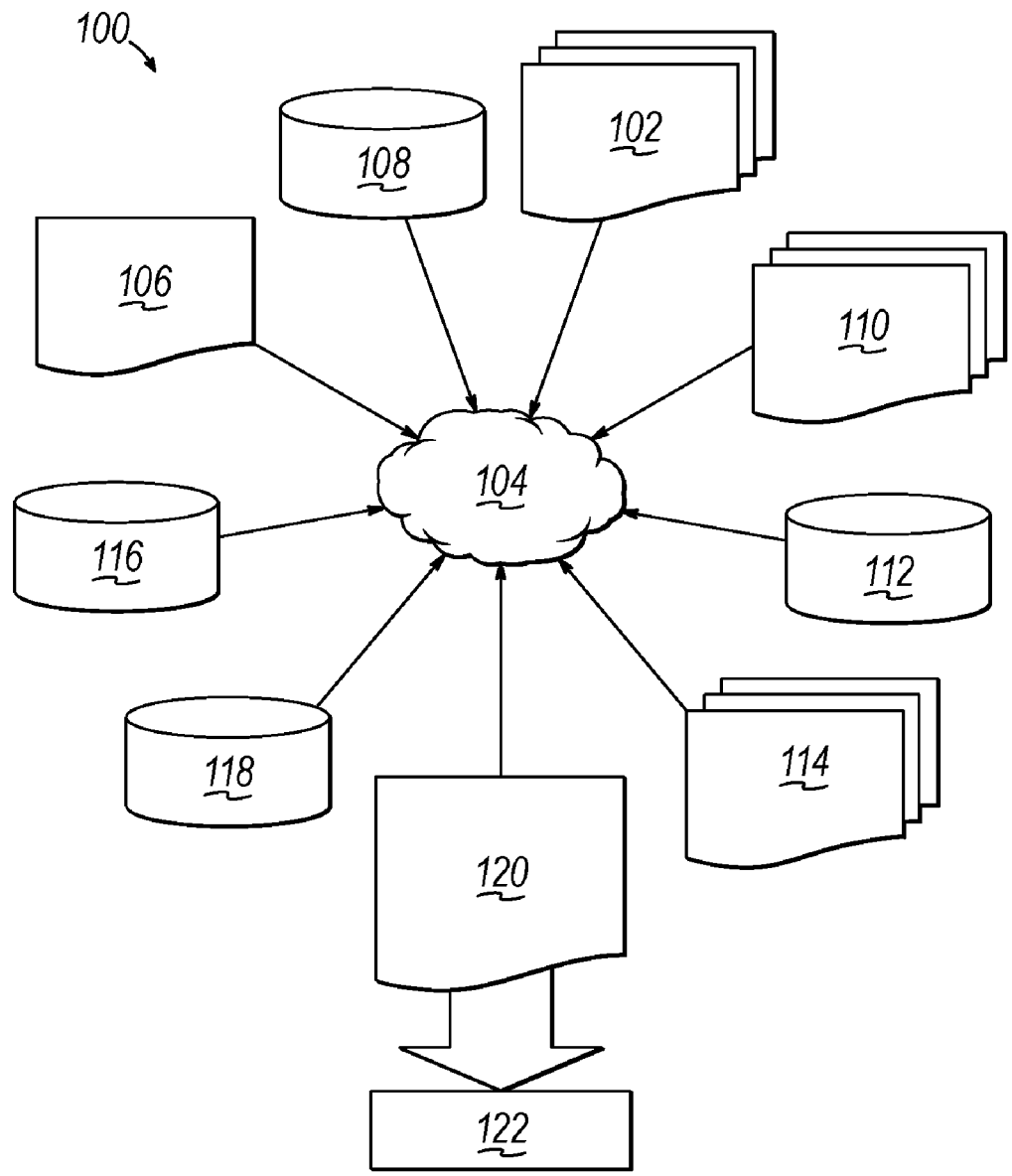
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 8 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 8. In one embodiment, design structure 120 may comprise a compiled, executable HDL simulation model that functionally simulates the devices shown in FIG. 8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 8. Design structure 120 may then proceed to a stage 122 where, for example, design structure 120:

proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating a heterojunction bipolar transistor, the method comprising:
    forming a first layer comprised of a material capable of forming an intrinsic base;
    forming a second layer on a top surface of the first layer; and
    forming a third layer on a top surface of the second layer, the third layer comprised of a material capable of forming an extrinsic base,
    wherein the second layer is comprised of a conductive material having a lower resistivity than the material of the first layer and a lower resistivity than the material of the third layer.

2. The method of claim 1 wherein forming the second layer on the top surface of the first layer further comprises:
    depositing a first sub-layer on the top surface of the first layer;
    depositing a second sub-layer on the top surface of the first sub-layer; and
    reacting the first and second sub-layers to form the conductive material of the second layer.

3. The method of claim 2 wherein the second sub-layer is comprised of a refractory metal selected from titanium, cobalt, or tungsten, the first sub-layer is comprised of silicon, silicon and germanium, or a combination thereof, and the conductive material of the second layer is a silicide.

4. The method of claim 2 wherein, following the reaction of the first and second sub-layers to form the conductive material of the second layer, a portion of the first sub-layer separates the first layer from the second layer.

5. The method of claim 2 wherein the conductive material of the second layer is a silicide selected to have a sintering temperature of 900° C. or less, be stable on silicon up to a temperature of 950° C., and have a resistivity in a range of 10 $\mu\Omega$-cm to 20 $\mu\Omega$-cm.

6. The method of claim 2 wherein the conductive material of the second layer is comprised of titanium, cobalt, or tungsten.

7. The method of claim 6 wherein the conductive material of the second layer is further comprised of silicon or an alloy of silicon and germanium.

8. The method of claim 1 wherein the second layer is comprised of a silicide, and further comprising:
    forming a fourth layer comprised of a silicide on a top surface of the third layer and separated from the silicide of the second layer by the third layer.

9. The method of claim 1 further comprising:
    forming an opening that extends through the second layer and the third layer to the first layer;
    forming at least one dielectric spacer on the third layer bordering the opening;
    forming an emitter that extends through the opening to land on the first layer and that partially covers a top surface of the third layer; and
    forming a fourth layer comprised of a silicide on a portion of the top surface of the third layer that is not partially covered by the emitter,
    wherein the at least one dielectric spacer isolates the emitter from the third layer.

10. The method of claim 9 wherein the first layer is formed on a top surface of a substrate, and further comprising:
    forming a collector in an active region of the substrate at a location aligned vertically with the emitter.

11. The method of claim 8 wherein the emitter, the first layer, and the collector have a vertical ordered arrangement relative to the top surface of the substrate.

* * * * *